(12) United States Patent
Takahashi et al.

(10) Patent No.: US 6,333,231 B1
(45) Date of Patent: Dec. 25, 2001

(54) METHOD FOR MANUFACTURING SEMICONDUCTOR MEMORY

(75) Inventors: Hiroaki Takahashi; Masaru Seto, both of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/668,308

(22) Filed: Sep. 25, 2000

(30) Foreign Application Priority Data

Mar. 27, 2000 (JP) .................................................. 12-086595

(51) Int. Cl.[7] .................................................. H01L 21/336
(52) U.S. Cl. .................................................. 438/289
(58) Field of Search .................................................. 438/289, 279, 438/275, 276, 278, 290, 291, 795

(56) References Cited

U.S. PATENT DOCUMENTS

| 4,129,936 | * | 12/1978 | Takei ................................... 438/278 |
| 4,364,167 | * | 12/1982 | Donley ................................. 438/130 |
| 5,264,724 | * | 11/1993 | Brown et al. ........................ 257/347 |
| 5,736,420 | * | 4/1998 | Min et al. ............................. 438/278 |
| 6,177,350 | * | 1/2001 | Sundarrajan et al. ............... 438/688 |
| 6,190,926 | * | 2/2001 | Perino et al. ............................. 438/3 |

* cited by examiner

*Primary Examiner*—Richard Elms
*Assistant Examiner*—Beth E. Owens
(74) *Attorney, Agent, or Firm*—Venable; Robert J. Frank; Allen Wood

(57) ABSTRACT

A method for manufacturing read-only memory. In each memory cell on a wafer, a gate electrode 3a is formed on a silicon substrate 1 with an intermediary of a gate oxide film 2, and an oxide film 4 is formed to cover the surface of the silicon substrate. After an inter-layer dielectric film 6 is grown on the oxide film 4 by LPCVD, this inter-layer dielectric film 6 is put to rapid thermal processing at 700° C. to 800° C. for about 60 seconds to remove the water content of the inter-layer dielectric film 6. This eliminates chances of insulation deterioration when semi-finished wafers are put into long-term storage. After the steps just before data writing have been finished, the wafers can be put into long-term storage, so that time from decision of data to write until product completion can be reduced.

16 Claims, 8 Drawing Sheets

WATER CONTENT REMOVAL CHARACTERISTICS
OF INTER-LAYER DIELECTRIC FILM

Fig.7
STEP 61
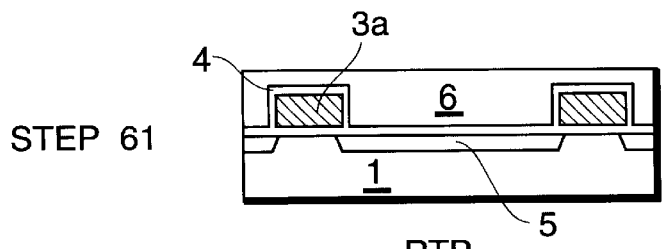
STEP 62
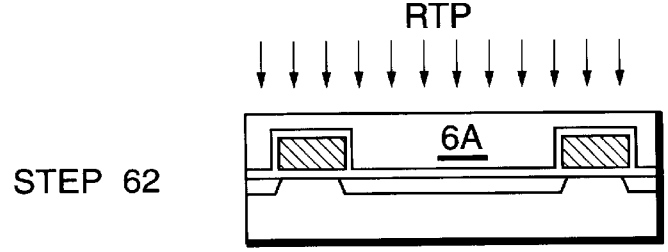
STEP 63
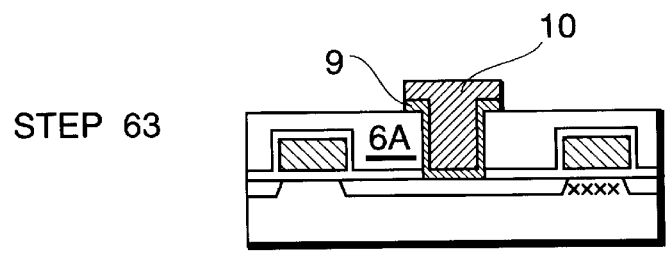
STEP 64
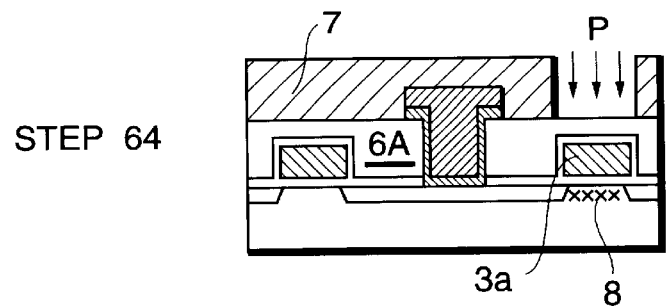
STEP 65
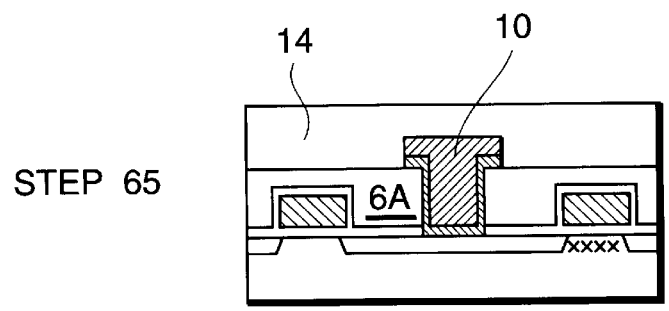

METHOD FOR MANUFACTURING SEMICONDUCTOR MEMORY

BACKGROUND OF THE INVENTION

1. Field of the Invention

The present invention relates to a method for manufacturing a semiconductor read-only memory, such as a mask ROM, and a method for conserving a semiconductor wafer from which to make the above-mentioned memory.

2. Description of the Related Art

A conventional mask ROM, in which one memory cell includes an insulated gate transistor such as a MOS transistor, is generally manufactured in steps as follows:

(1) Step (a)

A gate oxide film for a MOS transistor is formed on a p-type silicon substrate.

(2) Step (b)

A gate electrode layer is formed by depositing a polysilicon film on the wholesale surface of the above-mentioned oxide film and diffusing impurities into the polysilicon film to impart electric conductivity to it.

(3) Step (c)

The gate electrode layer is patterned by photolithography to form gate electrodes of the MOS transistors as the insulated gate transistors used in the memory cells.

(4) Step (d)

Prior to the implantation of phosphorus ions into the surface of the silicon substrate on which the gate electrode has been formed, an oxide film is formed to protect the substrate surface from ion implantation.

(5) Step (e)

For the source and drain regions consisting of doped regions to be formed on both sides of the gate electrode, phosphorus ions are implanted in the regions on both sides of the gate electrode through the protective oxide film. Thereafter, the phosphorus ions implanted in the oxide film are diffused in the silicon substrate by heat treatment. By this thermal diffusion, the source and drain regions are formed which correspond to the source and drain electrodes of a MOS transistor.

(6) Step (f)

By chemical vapor deposition (CVD), an inter-layer dielectric film of silicon dioxide is formed on the above-mentioned oxide film of the silicon substrate at a substrate temperature of about 400° C. The inter-layer dielectric film can be grown by CVD at lower temperatures than in thermal oxidation widely used to obtain silicon dioxide by heating silicon, and this dielectric film is superior in terms of freedom from inadvertent thermal diffusion of the impurities in the source and drain regions.

(7) Step (g)

A photoresist film is formed on the above-mentioned inter-layer dielectric film. After this, by using a memory pattern based on data to be written on a ROM, the photoresist film is selectively exposed to light and developed, a resist pattern corresponding to the ROM data is formed. By using this resist pattern, ions are implanted below the gate electrodes of the memory cells selected to change the threshold voltages of the MOS transistors. By selective ion implantation described above, data is written in the ROM transistors.

(8) Step (h)

After the resist pattern is removed, metal lines of aluminum, for example, are formed on the gate electrode, source and drain of the MOS transistor.

After this, a passivation film is formed to protect the surfaces of the MOS transistors and their wiring patterns, and then the semiconductor wafer on which many memory cells have been formed undergoes inspection. After inspection, the wafer is cut into individual memory chips. Each memory chip is mounted on a substrate for a package, and the memory chip is provided with external leads and packaged. Thus, a memory device is completed.

Meanwhile, the conventional method for manufacturing a mask ROM mentioned above has a problem as follows.

Efforts are being made to reduce the required turn-around time (hereafter referred to merely as TAT) from the stage of design when the memory contents of a mask ROM are decided till the product is completed. A possible solution is to store semiconductor wafers that have passed the above-mentioned Steps up to (f) and after the memory contents have been decided, start the successive manufacturing steps (g) and (h) mentioned above.

However, if the storage period of the wafers stretches to a long period of six months or so, semiconductor wafers that have undergone Step (f) and have been covered with an interlayer dielectric film consisting of porous silicon dioxide formed by CVD, will absorb moisture in the air, potentially resulting in the above-mentioned inter-layer dielectric film decreasing in insulating performance.

Therefore, an object of the present invention is to provide a method for manufacturing a semiconductor memory capable of having semi-finished wafers kept in storage for longer periods than found in the prior art and also capable of reducing the TAT.

Another object of the present invention is to provide a method of safekeeping semiconductor wafers for semiconductor memories for longer periods than found in the prior art.

SUMMARY OF THE INVENTION

To achieve the one object, according to the present invention, there is provided a method for manufacturing a semiconductor read-only memory on which data has been written, comprising the steps of forming on a semiconductor substrate a plurality of memory cells for storing data, each consisting of an insulated gate transistor having a gate electrode; forming on the semiconductor substrate by chemical vapor deposition a dielectric film to bury therein the insulated gate transistors formed on the semiconductor substrate; performing thermal processing on the substrate to reduce the water content of the dielectric film; and writing data by implanting ions into the memory cells selected to bias a threshold voltage of the transistors of the memory cells selected corresponding to data to be written.

In the above manufacturing method, the thermal processing may be performed in an inert gas atmosphere.

Heating lamps may be used as heat sources in the thermal processing.

A silicon substrate may be used for the semiconductor substrate.

In the ion implantation to the memory cells selected, a mask may be used to permit ions to be implanted into the semiconductor substrate below the gate electrode while passing by the gate electrodes of the transistors selected.

The temperature of the thermal processing may be lower than the melting point of a material for the gate electrode.

The dielectric film may be a silicon dioxide film and the silicon dioxide film may be formed by atmospheric pressure CVD at 600° C. or below.

The thermal processing may be performed under conditions of a temperature range of 700° C. to 800° C. for 60 seconds or less in a nitrogen gas atmosphere.

Metal wiring may be formed for the memory cells on the dielectric film, and after said metal wiring is formed, the thermal processing may be formed on the substrate at a temperature lower than the melting point of the metal wiring.

To achieve the other object, there is provided a method for storing semiconductor wafers for manufacture of read-only memory in which data has been written, comprising the steps of:

forming a plurality of memory cells for storing data on a semiconductor substrate made of a semiconductor wafers;

forming a dielectric film on the semiconductor substrate to blanket the memory cells;

performing thermal processing on the substrate to reduce the water content of the dielectric film; and storing the semiconductor substrate after receiving the thermal processing until data is written in the memory cells.

The semiconductor substrate may be stored under the condition that a water-proofing film to prevent entry of moisture into the dielectric film is formed on the surface of the heat-treated dielectric film.

In the storage method, the waterproofing film may be formed by a barrier metal.

BRIEF DESCRIPTION OF THE DRAWINGS

FIG. 7 shows the manufacturing steps of a mask ROM showing a sixth embodiment of the present invention.

DESCRIPTION OF PREFERRED EMBODIMENTS (First Embodiment)

Figure 1A:
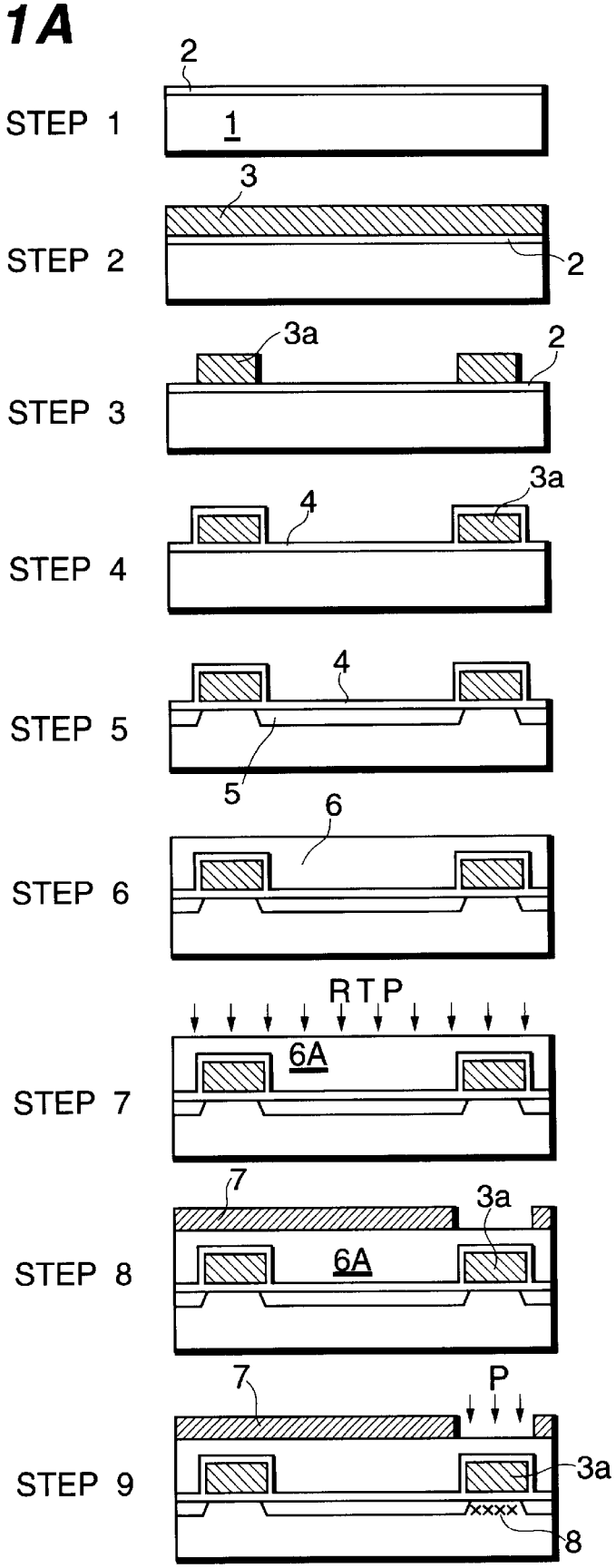
FIGS. 1A and 1B show the manufacturing steps of a mask ROM showing a first embodiment of the present invention.
Figure 1B:
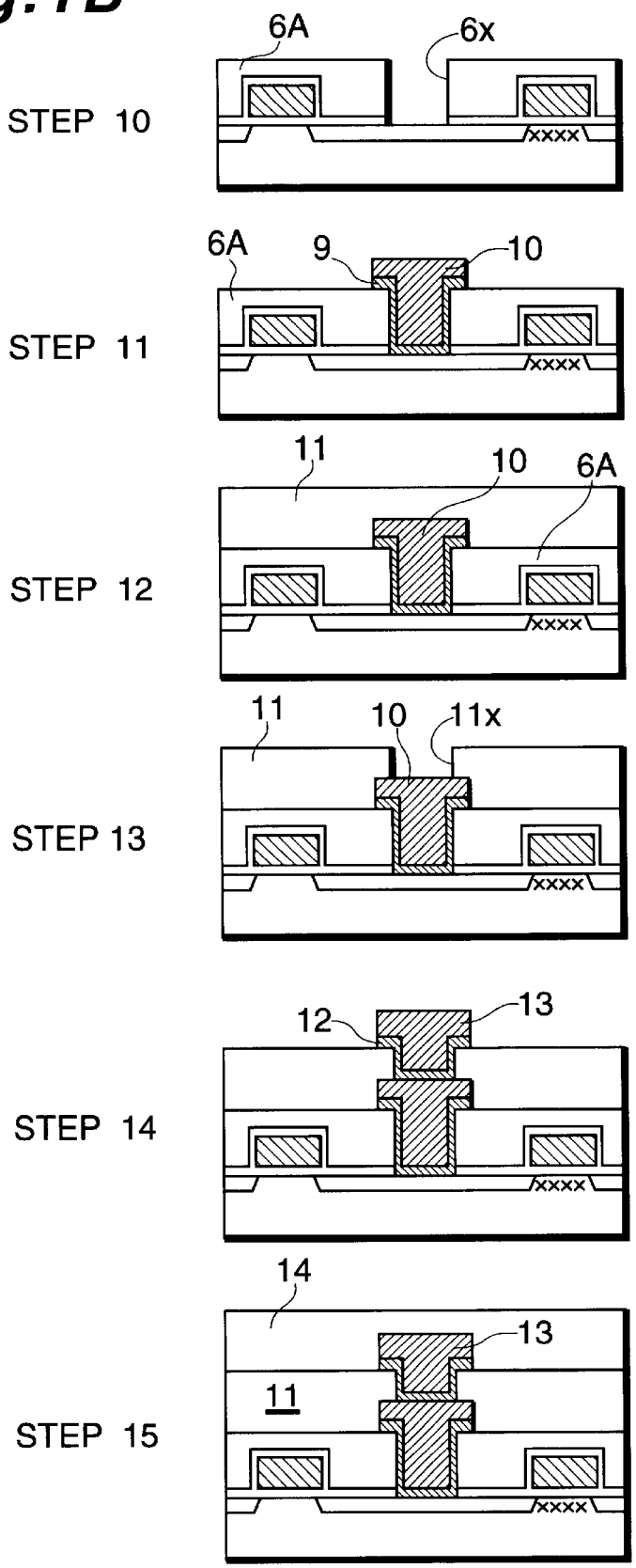

FIGS. 1A and 1B show the manufacturing steps of a mask ROM showing a first embodiment of the present invention. The process for manufacturing a mask ROM will be described with reference to FIGS. 1A and 1B.

(1) Step 1

The surface of a p-type silicon substrate 1 is oxidized with oxygen gas at 850~900° C. and at normal pressures (1 atm.) for 20~30 minutes to form a gate oxide film 2 with a thickness of 0.01~0.02 μm over the whole surface.

(2) Step 2

A polysilicon film 3 with a thickness of 0.3~0.4 μm is deposited over the whole surface of the gate oxide film 2 by low-pressure CVD (LPCVD) using silane-based gas. In addition, to impart electric conductivity to this polysilicon film 3, using a gas containing impurities, such as phosphorus, heated to about 800° C. performs impurity diffusion. By this diffusion, phosphorus with a concentration of about $5 \times 10^{24}$ atoms/m$^2$ is introduced into the whole body of the polysilicon film 3, so that the conductive gate electrode layer 3 is formed.

(3) Step 3

Gate electrodes 3a are formed by photolithography. More specifically, though this is not illustrated, as has been well known, a photoresist film is applied to the surface of the gate electrode layer 3, the photoresist film is exposed through a gate electrode pattern and developed, and thus, the photoresist pattern is obtained. By using the photoresist pattern as an etching mask, the gate electrode layer 3 is etched to form the gate electrodes 3a of the MOS transistors that are to serve as memory cells.

(4) Step 4

The surface of the silicon substrate 1 on which the gate electrodes 3a has been formed is oxidized with oxygen gas at 850~900° C. for about 60 minutes under normal pressure to form an approximately 0.02 μm-thick oxide film for ion implantation. As has been well known, this oxide film 4 protects the surface of the silicon substrate 1 from being damaged by ion implantation.

(5) Step 5

Phosphorus ions or arsenic ions are accelerated at energies of about 30 keV to 50 keV and driven into the protective oxide film 4. The silicon substrate 1 with phosphorous ions or arsenic ions implanted into the oxide film 4 is subjected to heat treatment with nitrogen gas at higher than 800° C. under normal pressure for more than 30 minutes, by which the phosphorous ions or arsenic ions diffuse in the silicon substrate 1. Thus, the source/drain-diffused layer 5 is formed, which corresponds to the source electrode and the drain electrode of each memory cell.

(6) Step 6

A silicon dioxide film with a thickness of about 0.3 μm is grown on the oxide film 4 of the silicon substrate 1 at a temperature of about 400° C. by plasma CVD using oxygen and silane-based $Si(C_2H_5)_4$ gas. Furthermore, on top of this silicon dioxide film, another silicon dioxide film with a thickness of about 0.5 μm is grown at about 400° C. by atmospheric pressure CVD using ozone and TEOS (tetraethyl orthosilicate) gas. In this way, an inter-layer dielectric film 6 with a total thickness of about 0.8 μm, consisting of silicon dioxide films formed by CVD, is formed.

(7) Step 7

The silicon substrate 1 on which the inter-layer dielectric film 6 has been formed is preferably put to rapid thermal processing (RTP) for 60 seconds at a temperature of 725° C. with infrared ray lamps as heat sources in a nitrogen gas atmosphere at normal pressure. In this manner, the water content contained inside is reduced by its desorption and a heat-treated inter-layer dielectric film 6A is obtained. According to this process, the interior temperature of the heating equipment can be raised from room temperature to a desired processing temperature in a few minutes, which is far shorter than in heat treatment with a conventional heating furnace. Therefore, desired dehydration effects can be obtained without incurring unwanted thermal diffusion of the dopant atoms in the source and drain regions. The temperature of this process should preferably be selected to be in the range of 700° C. to 800° C.

(8) Step 8

A photoresist film is applied to the surface of the inter-layer dielectric film 6A, and the resist film is exposed through a memory pattern, created to write data on an object ROM, and developed, and thus a resist pattern 7 is formed. This resist pattern 7 has openings at only those portions of it which correspond to the gate electrodes 3a of the memory cells where ions are to be implanted.

(9) Step 9

Phosphorus ions are accelerated at an energy of about 1 MeV and driven into the silicon substrate 1 through the resist pattern 7. Consequently, the phosphorous ions are implanted below the gate electrodes 3a of the memory cells where data are written, with which the data-written layer 8 of the ROM is formed.

(10) Step 10

The resist pattern 7 is removed, and a first hole 6x that leads to the source/drain diffused layer 5 is etched through the inter-layer dielectric film 6A by photolithography.

When necessary, a hole that leads to the gate electrode 3a may be etched simultaneously when the first hole 6x is etched.

(11) Step 11

A first barrier metal 9 is formed on the top surface of the inter-layer dielectric film 6A and on the internal surface of the hole 6x. The barrier metal, as is well known, consists of TiN or TiW, for example, and prevents reaction between the aluminum electrode, which will be described later, and the silicon substrate 1 by their direct contact. A wiring metal, such as aluminum, is vapor-deposited on the top and internal surfaces of the barrier metal 9. Furthermore, the top metal film and the barrier metal 9 are patterned together by photolithography to leave behind a specified wiring pattern, thereby forming first metal wiring 10. The material of the first metal wiring 10 has a melting point sufficiently higher than the heating temperature in the above-mentioned RTP process.

(12) Step 12

To form upper wiring 13, another dielectric film 11 is formed on the metal wiring 10 and the inter-layer dielectric film 6A by the same method as with the dielectric film 6A.

(13) Step 13

A second hole 11x, which leads to the metal wiring 10, is etched through the dielectric film 11 by photolithography.

(14) Step 14

A second barrier metal 12 is formed on the surface of the dielectric film 11 and also on the internal surface of the second hole 11x, and a wiring metal, such as aluminum, is vapor-deposited on the top and internal surfaces of the barrier metal 12. The top metal film and the barrier metal 12 are patterned together by photolithography to leave behind a specified wiring pattern, thus forming a second metal wiring 13 at the top of the layers.

(15) Step 15

A protective passivation film 14, consisting of a silicon nitride film (SiN) is formed on the surfaces of the dielectric film 11 and the metal wiring 13 by plasma CVD, for example.

The other steps, including wafer quality check, separation of the memory chips, mounting in a case, connection to external leads, and encapsulated, are the same as with conventional semiconductor devices.

In a mask ROM manufactured as described, the memory cells, which have ions implanted in Step 9 and the threshold voltage of which is biased with respect to that of the memory cells with no ions implanted, are set to the ON state. On the other hand, the memory cells, in which ions are not implanted, are set to the OFF state. When a selection signal is supplied to the gate electrode 3a of a memory cell in which a bit has been stored as a result of the above-mentioned data writing process, the conducting state between the source and the drain can be detected and thus the stored bit can be read.

Figure 2:
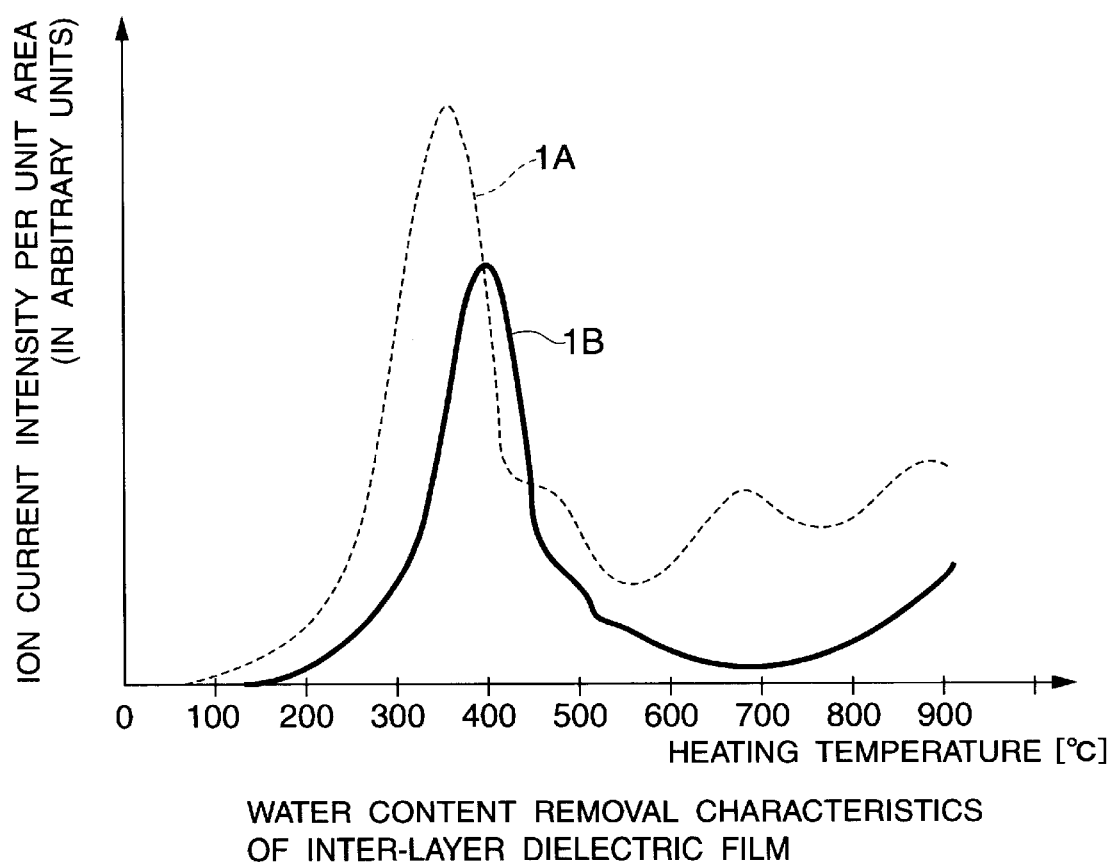
FIG. 2 is a diagram showing water content removal characteristics of the inter-layer dielectric film 6.

FIG. 2 is a diagram showing the water content removal characteristics of the inter-layer dielectric film 6.

FIG. 2 shows results of TDS (Thermal Detector Spectroscope) analysis to compare the water contents of samples, which include a silicon substrate 1A not treated by the RTP and a silicon substrate 1B treated by the RTP in Step 7, all of those silicon substrates having the inter-layer dielectric film 6 formed in Step 6. The horizontal axis represents the heating temperature that increases gradually, while the vertical axis represents the ion current intensity (in arbitrary units) in the sample chamber of the TDS mentioned above, which changes according to the water content desorbed from the inter-layers 6 and 6A as measured at respective levels of the heating temperature. The broken line in FIG. 2 indicates the characteristic of the silicon substrate 1A before the RTP, and the solid line indicates the characteristic of the silicon substrate 1B after the RTP. The integration values of the characteristics 1A and 1B shown in FIG. 2 represent the amounts of water desorbed from each sample substrate before and after the RTP. So, the difference of the values of those samples is the water content removed by the RTP. Therefore, according to the graphs of FIG. 2, the greater amount of water content can be desorbed by heating at 600 to 700° C.

As has been described, in the manufacturing process of a mask ROM according to the first embodiment of the present invention, after the inter-layer dielectric film 6 is formed in Step 6, the RTP is carried out in Step 7 to reduce the water content of the inter-layer dielectric film 6. For this reason, after the RTP is finished in Step 7, even if the water content of the inter-layer dielectric film 6 increases, it will take a long time until the water content reaches a level that causes a deterioration in performance. The inter-layer dielectric film 6 is less likely to deteriorate due to absorption of moisture, making it possible to keep wafers in a semi-finished state in storage for longer periods than before, which is an advantage of the present invention. Moreover, in this example shown in FIG. 2, two layers of metal wiring 10 and 13 are formed by Steps 11 to 14 and the provision of two wiring layers decreases the wiring resistance, thus reducing delay time in reading of the memory, which is another advantage of the present invention.

(Second Embodiment)

Figure 3:
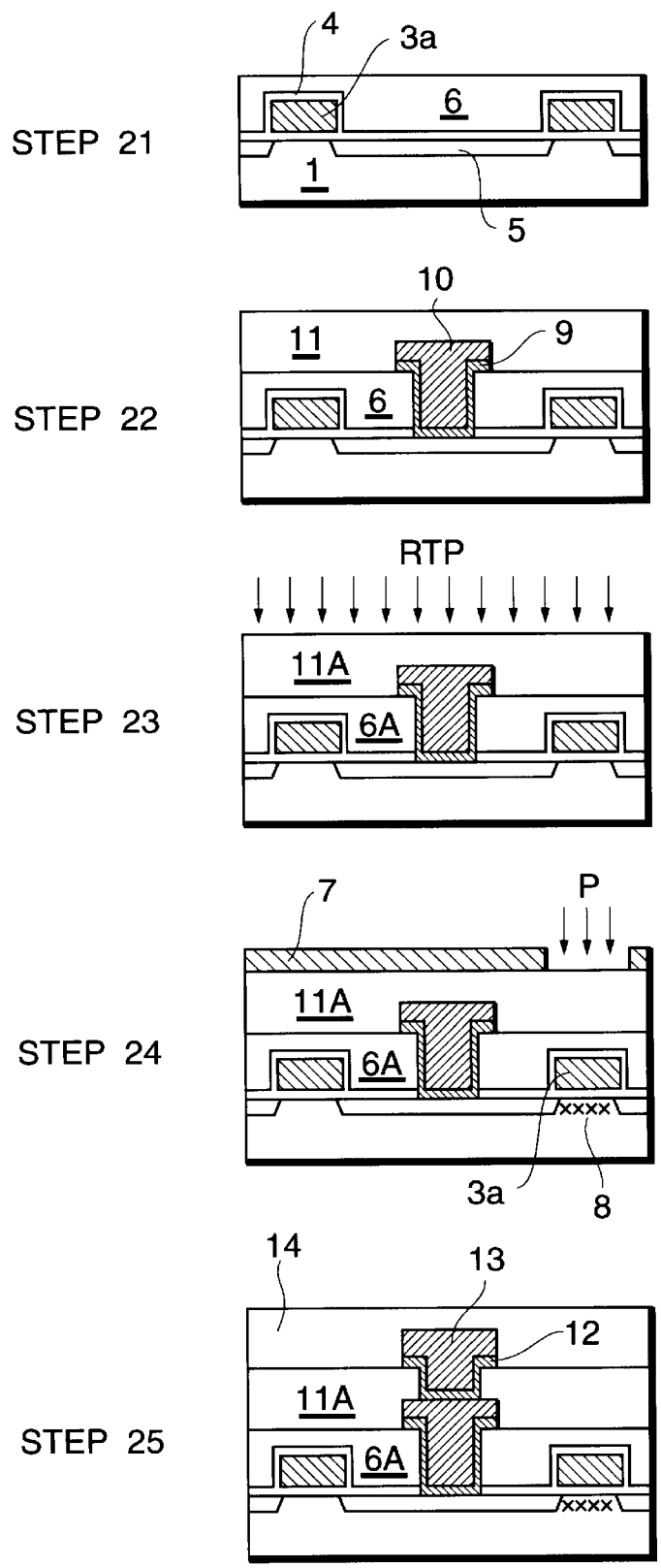
FIG. 3 shows the manufacturing steps of a mask ROM showing a second embodiment of the present invention.

FIG. 3 shows the manufacturing steps of a mask ROM showing a second embodiment of the present invention. The same components as those used in FIGS. 1A and 1B, are designated by the common reference numerals. The manufacturing method of a mask ROM will be described with reference to FIG. 3.

(1) Step 21

By the same processes of Steps 1 to 6 in FIG. 1A, an oxide film 2, gate electrodes 3a, an oxide film 4, a source/drain diffused layer 5 and an inter-layer dielectric film 6 are formed successively on a p-type silicon substrate 1.

(2) Step 22

The same processes of Steps 10 to 12 in FIG. 1B are carried out. More specifically, to form lower metal wiring, a first hole 6x, which leads to the source/drain diffused layer 5, is etched through the inter-layer dielectric film 6. Holes, which lead to gate electrode layers 3, are etched and metal wiring is formed. Then, a first barrier metal 9 is formed on the surface of the inter-layer dielectric film 6 and also on the internal wall of the hole 6x, and a refractory metal, such as tungsten, is vapor-deposited to the barrier metal 9. The barrier metal 9 and the refractory metal film are patterned to form first metal wiring 10. Further, a dielectric film 11 is formed on the surfaces of the metal wiring 10 and the inter-layer dielectric film 6.

(3) Step 23

The same RTP as in Step 7 in FIG. 1A is performed at a lower temperature than the melting point of the metal wiring 10. More specifically, the silicon substrate 1 on which the inter-layer dielectric film 6 and the dielectric film 11 have been formed receives rapid thermal processing (RTP) for 60 seconds at a temperature of 725° C. with infrared lamps or the like in a nitrogen gas atmosphere under normal pressure. Thus, heat-treated inter-layer dielectric films 6A and 11A are formed.

(4) Step 24

ROM data is written by the same writing process as in Steps 8 and 9 in FIG. 1A. More specifically, a photoresist film is applied to the surface of the dielectric film 11, and the resist film is exposed to light through a memory pattern for writing based on data of an object ROM, and by the subsequent development process, a resist pattern 7 is created. Phosphorus ions are implanted into the silicon substrate 1 through the resist pattern 7. The phosphorus ions are driven into the silicon substrate 1 below the gate electrodes 3a of the memory cells in which data is written. In this manner, the data-written layers 8 of a ROM are formed.

(5) Step 25

The same processes as in Steps 13 to 15 in FIG. 1B are carried out. More specifically, to form upper metal wiring, a second hole 11x, which leads to the metal wiring 10 is etched through the dielectric film 11A. Then, a second barrier metal 12 is formed on the surface of the dielectric film 11A and on the internal wall of the hole 11x, and a wiring metal, such as aluminum, is vapor-deposited on the barrier metal 12. By patterning the barrier metal 12 and the wiring metal film, second metal wiring 13 is formed. Further, a protective passivation film 14 is formed on the dielectric film 11A and the metal wiring 13.

The subsequent steps, including wafer quality check, separation of chips, mounting to a case, connection to external leads, and encapsulation, are the same as with the semiconductor device mentioned above.

In the manufacturing process of a mask ROM according to the second embodiment, after the inter-layer dielectric films 6 and 11 have been formed in Step 22, the RTP is performed in Step 23 to reduce the water content of the inter-layer dielectric films 6 and 11. Therefore, after the RTP in Step 23, the inter-layer dielectric films 6A and 11A are less likely to deteriorate in performance due to moisture absorption, which offers an advantage that wafers can be stored in semi-finished state for a long period of time. Further, because the metal wiring 10 as the first-layer wiring has been formed in Step 22, there is not much processing in Step 25 after ROM data has been written in Step 24. Therefore, TAT from the decision of memory contents till the completion of a product can be reduced.

(Third Embodiment)

Figure 4:
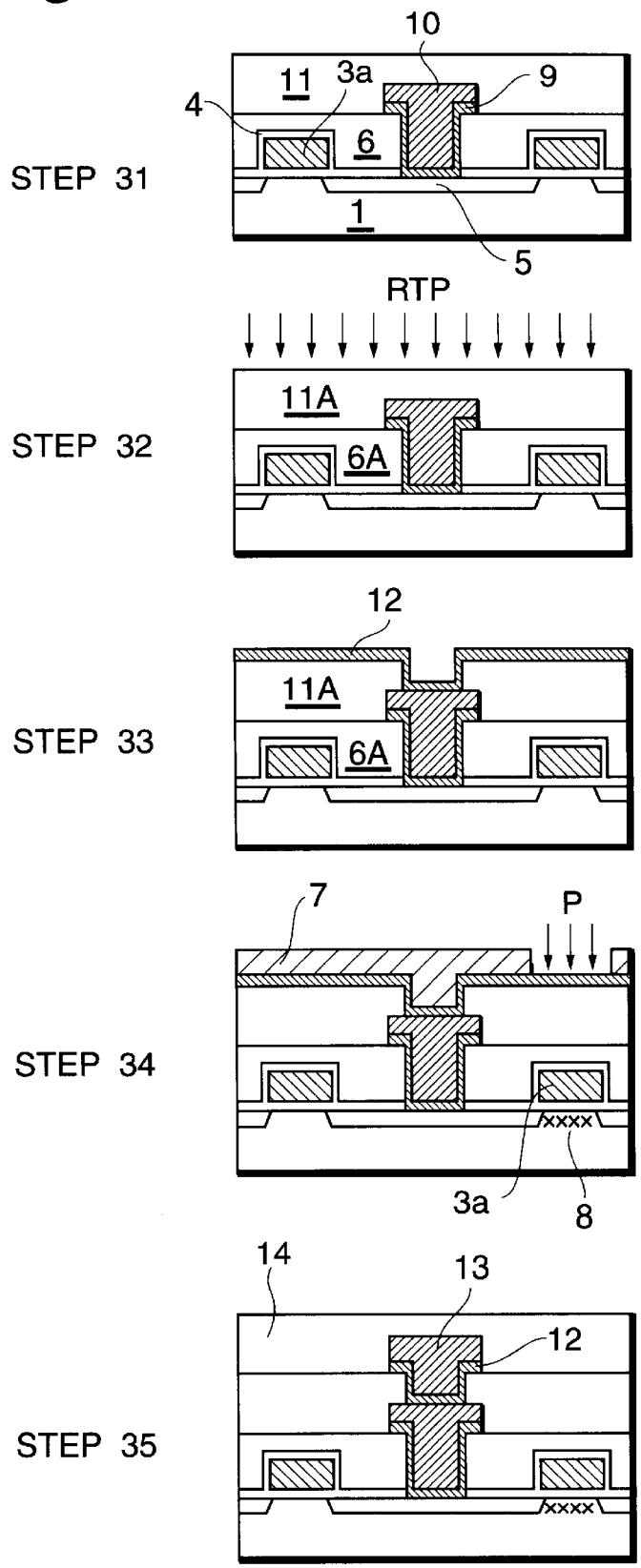
FIG. 4 shows the manufacturing steps of a mask ROM showing a third embodiment of the present invention.

FIG. 4 shows the manufacturing steps of a mask ROM showing a third embodiment of the present invention. The same components as those used in FIGS. 1A and 1B are designated by the common reference numerals. The manufacturing method of a mask ROM will be described with reference to FIG. 4.

(1) Step 31

By the same processes of Steps 1 to 6 in FIG. 1A, an oxide film 2, gate electrodes 3a, an oxide film 4, a source/drain diffused layer 5 and an inter-layer dielectric film 6 are formed successively on a p-type silicon substrate 1. Next, by the same processes of Steps 10 to 12 in FIG. 1B, a first hole 6x, which leads to the source/drain diffused layer 5 is etched through the inter-layer dielectric film 6a and first metal wiring 10 of a refractory metal, such as tungsten, is formed. Holes, which lead to the gate electrode layers 3, are etched and metal wiring is formed. Further, a dielectric film 11 is formed on the surfaces of the metal wiring 10 and the inter-layer dielectric film 6.

(2) Step 32

The same RTP as in Step 7 in FIG. 1A is performed.

(3) Step 33

A second hole 11x, which leads to the metal wiring 10, is etched through the dielectric film 11, and a second barrier metal 12 is formed on the surfaces of the hole 11x and the dielectric film 11.

(4) Step 34

ROM data is written in the same manner as in Steps 8 and 9 in FIG. 1A.

(5) Step 35

The resist pattern 7 is removed, a wiring metal, such as aluminum, is vapor-deposited on the barrier metal 12, and the wiring metal is patterned to form second metal wiring 13. Further, a protective passivation film 14 is formed on the surfaces of the dielectric film 11 and the metal wiring 13.

The subsequent wafer quality check, separation of chips, mounting to a case, connection to external leads, and encapsulation, are the same as with semiconductor devices in general.

As described above, in the manufacturing process of a mask ROM according to the third embodiment, after the inter-layer dielectric films 6 and 11 have been formed in Step 31, the RTP is performed in Step 32 to remove the water content from the heat-treated inter-layer dielectric films 6A and 11A. A resulting advantage is that after the barrier metal 12 has been formed in Step 33, the inter-layer dielectric films 6A and 11A are less likely to deteriorate in performance due to absorption of moisture, so that semi-finished wafers can be conserved for longer periods of time. Moreover, the barrier metal 12 covering the heat-treated dielectric film 11A serves as a water-resistant coating to impede moisture absorption of the inter-layer dielectric films 6A and 11A. This further ensures a long-term conservation. Meanwhile, because the metal wiring 10 as the first layer has been formed in Step 31 and the barrier metal 12 of the second layer has been formed in Step 33, there is not much processing in Step 35 after data has been written in the memory cells, so that the TAT period from the decision of memory contents until the completion of a product, can be further reduced.

(Fourth Embodiment)

Figure 5:
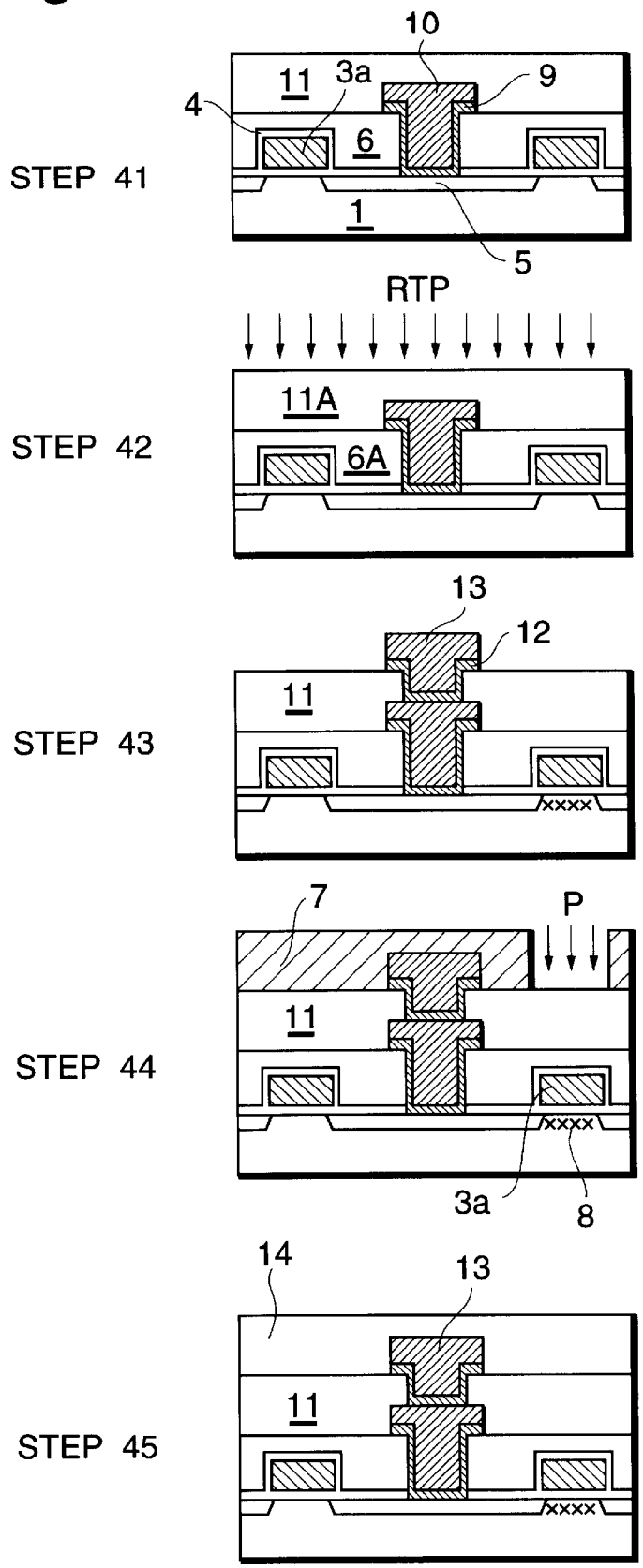
FIG. 5 shows the manufacturing steps of a mask ROM showing a fourth embodiment of the present invention.

FIG. 5 shows the manufacturing steps of a mask ROM showing a fourth embodiment of the present invention. The same components as those used in FIGS. 1A and 1B are designated by the common reference numerals. The manufacturing method of a mask ROM will be described with reference to FIG. 5.

(1) Step 41

By the same processes in Steps 1 to 6 in FIG. 1A, an oxide film 2, gate electrodes 3a, an oxide film 4, a source/drain diffused layer 5, and an interlayer dielectric film 6 are formed successively on a p-type silicon substrate 1. Next, by the same processes in Steps 10 to 12 in FIG. 1B, a hole, which leads to the source/drain diffused layer 5, is formed and first metal wiring 10 is formed by a refractory metal, such as tungsten. Holes, which lead to the gate electrodes 3, are etched and metal wiring is formed. Further, a dielectric film 11 is formed on the surfaces of the metal wiring 10 and the inter-layer dielectric film 6.

(2) Step 42

The same RTP as in Step 7 in FIG. 1A is performed.

(3) Step 43

The processes as in Steps 13 and 14 in FIG. 1B are carried out. In other words, a second hole $11x$, which leads to the metal wiring 10 is etched through the dielectric film 11. Then, a second barrier metal 12 is formed on the surface of the dielectric film 11 and the internal wall of the hole $11x$, a wiring metal, such as aluminum, is vapor-deposited on the surface of the barrier metal 12. By patterning the top metal film and the barrier metal 12 together to leave behind a specified wiring pattern, second metal wiring 13 is formed.

In the fourth embodiment, after the RTP has been carried out on the dielectric films 6 and 11 for dehydration and the second metal wiring 13 has been formed, the wafer is put into storage so that it may be used when necessity requires.

(4) Step 44

Subsequently, ROM data is written by the writing process in Steps 8 and 9 in FIG. 1A.

(5) Step 45

The resist pattern 7 is removed, and a protective passivation film 14 is formed on the surfaces of the dielectric film 11 and the metal wiring 13.

The subsequent steps, such as wafer quality check, separation of chips, mounting to a case, connection to external leads, and encapsulation, are the same as with semiconductor devices in general.

As has been described, in the manufacturing process of a mask ROM according to the fourth embodiment, after the inter-layer dielectric films 6 and 11 have been formed in Step 41, the RTP is performed in Step 42 to remove the water content from the inter-layer dielectric films 6 and 11. Therefore, an advantage that accrues is that after the two layers of metal wiring 10 and 13 have been formed in Step 43, the dielectric films are less likely to decrease in performance and the wafers can be kept in storage in semi-finished state for long periods of time. Moreover, because the first and second layers of metal wiring 10 and 13 have been formed before Step 44 of data writing, there is not much processing in Step 45 and the TAT from the decision of memory contents until completion of a product can be reduced still more.

(Fifth Embodiment)

Figure 6:
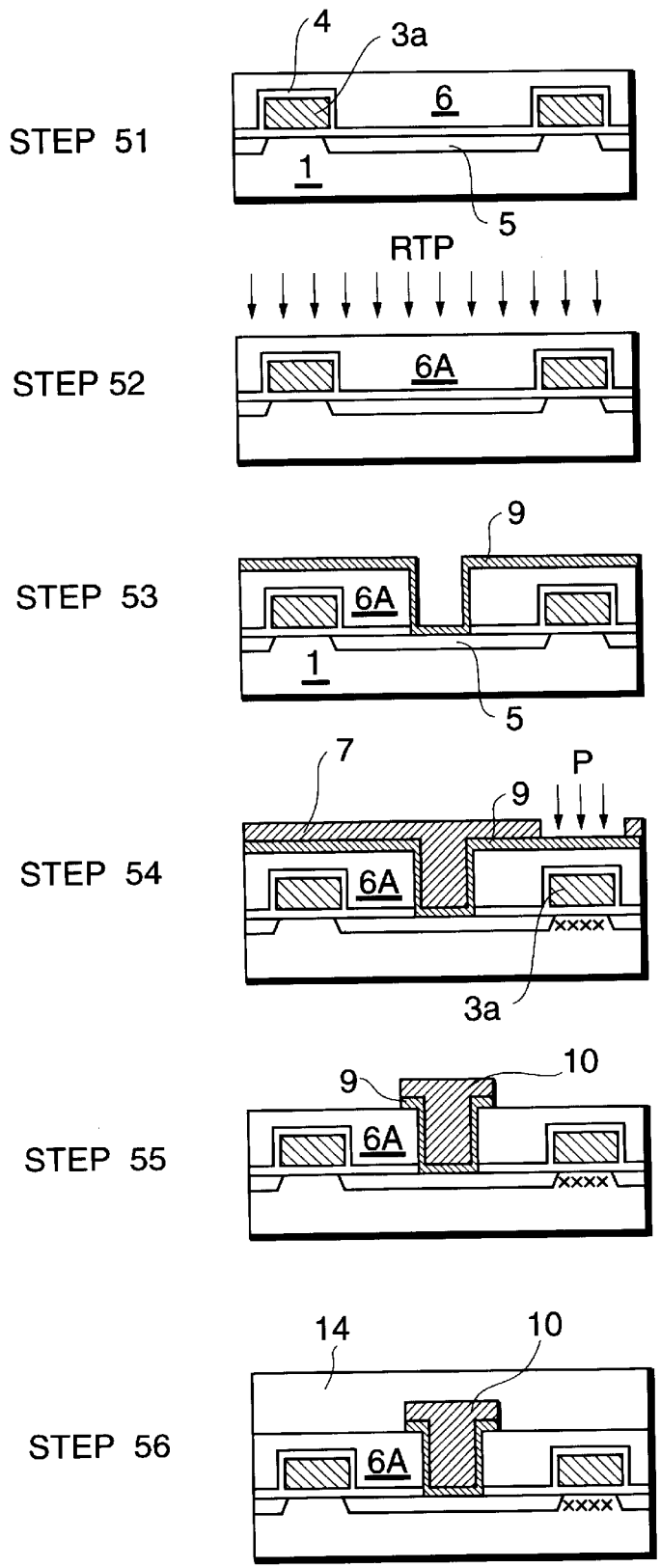
FIG. 6 shows the manufacturing steps of a mask ROM showing a fifth embodiment of the present invention.

FIG. 6 shows the manufacturing steps of a mask ROM showing a fifth embodiment in which the present invention is applied to a single-layer metal wiring instead of the two layers of metal wiring mentioned above. The same components as those used in FIGS. 1A and 1b are designated by the common reference numerals. The manufacturing method of a mask ROM will be described with reference to FIG. 6.

(1) Step 51

By the same processes in Steps 1 to 6 in FIG. 1A, an oxide film 2, gate electrodes $3a$, an oxide film 4, a source/drain diffused layer 5, and an inter-layer dielectric film 6 are formed successively on a p-type silicon substrate 1.

(2) Step 52

The same RTP as in Step 7 in FIG. 1A is performed.

(3) Step 53

A hole $6x$, which leads to the source/drain diffused layer 5 is etched through the inter-layer dielectric film 6A, and a barrier metal 9 is formed on the surface of the inter-layer dielectric film 6A and on the internal wall of the hole $6x$. Holes, which lead to the gate electrode 3, are also etched and metal wiring is formed.

(4) Step 54

ROM data is written by the same writing process as in Steps 8 and 9 in FIG. 1A.

(5) Step 55

The resist pattern 7 is removed, a wiring metal, such as aluminum, is vapor-deposited on the top surface and the inside wall of the barrier metal 9, and the top metal film and the barrier metal 9 are patterned together to form the metal wiring 10.

(6) Step 56

A protective passivation film 14 is formed on the surfaces of the inter-layer dielectric film 6A and the metal wiring 10.

The subsequent steps, such as wafer quality check, separation of chips, mounting to a case, connection to external leads, and encapsulation, are the same as with semiconductor devices in general.

As described above, in the manufacturing process of a mask ROM according to the fifth embodiment, after the inter-layer dielectric film 6 has been formed in Step 51, the RTP is performed in Step 52 to reduce the water content of the inter-layer dielectric film 6. An advantage accruing from this is that after the barrier metal 9 has been formed in Step 53, the inter-layer dielectric film 6 is less likely to deteriorate in performance due to absorption of moisture, and the wafers can be put into storage for long periods of time. As in the third embodiment of the present invention, the barrier metal 9 is used to also serve as a water-proof coating for the inter-layer dielectric films 6 and 11, the wafers are now better suited for long-term storage. Moreover, because the barrier metal 9 has been formed in Step 53 before ROM data is written, there is not much processing in Steps 55 and 56 after ROM data was written, so that the TAT from the decision of memory contents until the completion of a product can be reduced.

(Sixth Embodiment)

FIG. 7 shows the manufacturing process of a mask ROM according to a sixth embodiment in which the present invention is applied to a single-layer wiring like in the fifth embodiment. The same components as those in FIG. 1A are designated by the common reference numerals. The manufacturing method of a mask ROM will be described with reference to FIG. 7.

(1) Step 61

By the same processes in Steps 1 to 6 in FIG. 1A, an oxide film 2, gate electrodes $3a$, an oxide film 4, a source/drain diffused layer 5, and an interlayer dielectric film 6 are formed successively on a p-type silicon substrate 1.

(2) Step 62

The same RTP as in Step 7 in FIG. 1A is performed.

(3) Step 63

By the same processes in Steps 10 and 11 in FIG. 1B, a hole, which leads to the source/drain diffused layer 5, is formed, and metal wiring 10 of aluminum, for example, formed. Holes, which lead to the gate electrodes 3, are formed and metal wiring is formed.

(4) Step 64

ROM data is written by the same writing process as in Steps 8 and 9 in FIG. 1A.

(5) Step 65

The resist pattern 7 is removed, and a protective passivation film 14 is formed on the surfaces of the inter-layer dielectric film 6A and the metal wiring 10.

The subsequent steps, such as wafer quality check, separation of chips, mounting to a case, connection to external leads, and encapsulation, are the same as with general semiconductor devices.

As described above, in the manufacturing process of a mask ROM according to the sixth embodiment, after the inter-layer dielectric film 6 has been formed in Step 61, the RTP is performed in Step 62 to reduce the water content of the inter-layer dielectric film 6. An advantage accruing from the above thermal processing is that after the metal wiring 10 has been formed in Step 63, the inter-layer dielectric film 6 is less liable to deteriorate in performance due to moisture absorption, and the wafers can be stored in semi-finished state for long periods of time. Further, because the metal wiring 10 has been formed before the ROM data writing process in Step 64, there is not much processing in Step 65 after ROM data was written, and the TAT from the decision of memory contents until the completion of a product can be reduced.

Note that the present invention is not limited to the above-mentioned embodiments, but can be carried out in various ways. Possible variations are shown as examples(a) to (i) in the following.

(a) In Step 2 in FIG. 1A, the gate electrode layer 3 is formed by diffusing impurities into a polysilicon film, but the gate electrode layer 3 may be formed by a polycide. In this case, a polysilicon film with a thickness of about 0.15 μm is formed by LPCVD, and phosphorous atoms are diffused into the polysilicon film to a dopant concentration of about $5 \times 10^{24}$ atoms/m$^2$. Then, a compound of silicon with a refractory metal, such as tungsten, is vapor-deposited to a thickness of about 0.1 μm on the surface of the polysilicon film to obtain a conductive gate electrode layer. Because the polycide, which has better conductivity than the polysilicon, is used for the gate electrode, the electrode can be made with a shorter width. Further, because a refractory metal, such as tungsten, is used for the polycide, the gate electrode is not affected by the RTP in Step 7.

(b) In Step 2 in FIG. 1A, the gate electrode layer 3 is formed by diffusing impurities into the polysilicon film, but the gate electrode layer 3 may be formed by a refractory metal, such as tungsten. In this case, a tungsten film with a thickness of about 0.1 μm is formed by CVD. Because the tungsten has better conductivity than polysilicon, the gate electrode made of tungsten can be made with a shorter width, and is not affected by the RTP in Step 7.

(c) With regard to steps in FIGS. 1A and 1B, description has been made of a mask ROM having two layers of metal wiring 10 and 13. However, as shown in FIGS. 6 and 7, metal wiring of one layer may be used. In this case, a passivation film 14 is formed to cover the surfaces of the inter-layer dielectric film 6A and the metal wiring 10, which simplifies the manufacturing process.

(d) In Step 9 in FIG. 1A, description has been made of the formation of the ROM-data-written layer 8 by implanting phosphorus ions, but the data-written layer 8 may be formed by implanting boron ions accelerated at energy of about 500 keV. In this case, the threshold voltages of the memory cells are two kinds. By detecting a difference in the threshold voltages, data can be read out.

(e) For the gate electrodes 3a formed in Step 21 in FIG. 3, a polycide or a refractory metal other than polysilicon may be used.

(f) The RTP in Step 32 in FIG. 4 may be performed after the hole 11x or the barrier metal 12 has been formed in Step 33.

(g) The RTP in Step 42 in FIG. 5 may be performed after the hole 11x or the barrier metal 12 has been formed in Step 43.

(h) The RTP in Step 52 in FIG. 6 may be performed after the hole 6x or the barrier metal 9 has been formed in Step 53.

(i) The RTP in Step 62 in FIG. 7 may be performed after the hole 6x, the barrier metal 9 or the metal wiring 10 has been formed.

In the above-mentioned embodiments, description has been made of the MOS transistors as semiconductor memory. However, the present invention can be applied to the manufacture of other kinds of gate insulated transistors, such as MIS transistors. Moreover, as the semiconductor substrate, various kinds of compound semiconductors, such as GaAs, other than silicon may be used.

As has been described in detail, according to the present invention, thermal processing is performed to remove water content from the dielectric film formed by CVD. Consequently, the water absorbed in the dielectric film can be reduced and semi-finished wafers can be stored for long periods of time before they undergo the data writing process.

Further, if the gate electrode of a MOS transistor as a memory cell is formed by a material with a higher melting point than the temperature of thermal processing, an effect is that the gate electrode does not deteriorate by rapid thermal processing.

Further, by subjecting the dielectric film formed by low-pressure CVD at 600° C. or less to rapid thermal processing in which the dielectric film is exposed to a temperature of 700° C. to 800° C. for 60 seconds or less in a nitrogen gas atmosphere, the water content can be removed sufficiently from the dielectric film such that the insulating properties do not deteriorate during storage.

Further, after the dielectric film formation process, by forming metal wiring connecting memory cells by a material with a melting point higher than the temperature of thermal processing, this means that processes are carried out ahead of time, an effect that accrues from this is that the TAT from the decision of data writing contents until the completion of a product, because this means that the manufacturing process progresses faster than normal pace, the TAT from the decision of contents to be written until the completion of a product can be reduced.

What is claimed is:

1. A method or manufacturing a semiconductor read-only memory on which data has been written, comprising the steps of:

forming on a semiconductor substrate a plurality of memory cells for storing data, each including an insulated gate transistor having a gate electrode;

forming on said semiconductor substrate by chemical vapor deposition a dielectric film to bury therein said insulated gate transistors formed on said semiconductor substrate;

performing thermal processing on said substrate to reduce the water content of said dielectric film for long-term storage; and writing data by implanting ions into said memory cells selected to bias a threshold voltage of said transistors of said memory cells selected corresponding to data to be written.

2. A method for manufacturing a semiconductor read-only memory according to claim 1, wherein said step of performing thermal processing is conducted at a temperature in the range of about 700° C. to about 800° C., by exposing said substrate to infrared lamps in an inert atmosphere at about atmospheric pressure.

3. A method for manufacturing a semiconductor read-only memory according to claim 2, wherein said step of performing thermal processing is performed for a period of time not exceeding a few minutes.

4. A method for manufacturing a semiconductor read-only memory on which data has been written, comprising the steps of:

forming on a semiconductor substrate a plurality of memory cells for storing data, each including an insulated gate transistor having a gate electrode;

forming on said semiconductor substrate by chemical vapor deposition a dielectric film to bury therein said insulated gate transistors formed on said semiconductor substrate;

performing thermal processing on said substrate to reduce the water content of said dielectric film; and writing data by implanting ions into said memory cells selected to bias a threshold voltage of said transistors of said memory cells selected corresponding to data to be written, wherein metal wiring is formed for said memory cells on said dielectric film, and after said metal wiring is formed, said thermal processing is conducted on said substrate at a temperature lower than the melting point of said metal wiring.

5. A method for manufacturing a semiconductor read-only memory according to claim 4, wherein said thermal processing is performed in an inert gas atmosphere.

6. A method for manufacturing a semiconductor read-only memory according to claim 4, wherein heating lamps are used as heat sources in said thermal processing.

7. A method for manufacturing a semiconductor read-only memory according to claim 4, wherein a silicon substrate is used for said semiconductor substrate.

8. A method for manufacturing a semiconductor read-only memory according to claim 4, wherein in said ion implantation to said memory cells selected, a mask is used to permit ions to be implanted into said semiconductor substrate below said gate electrode while passing by said gate electrodes of said transistors selected.

9. A method for manufacturing a semiconductor read-only memory according to claim 4, wherein the temperature of said thermal processing is lower than the melting point of a material for said gate electrode.

10. A method for manufacturing a semiconductor read-only memory according to claim 4, wherein said dielectric film is a silicon dioxide film and said dioxide film is formed by atmospheric pressure CVD at 600° C. or below.

11. A method for manufacturing a semiconductor read-only memory according to claim 4, wherein said thermal processing is performed under conditions of a temperature range of 700° C. to 800° C. for 60 seconds or less in a nitrogen gas atmosphere.

12. A method for storing semiconductor wafers for manufacture of read-only memories in which data has been written, comprising of the steps of:

forming a plurality of memory cells for storing data on a semiconductor substrate made of a semiconductor wafer;

forming a dielectric film on said semiconductor substrate to cover said memory cells;

performing thermal processing on said substrate to reduce the water content of said dielectric film for long-term storage; and storing said semiconductor substrate after receiving said thermal processing until data is written in said memory cells.

13. A storage method according to claim 12, wherein said step of performing thermal processing is conducted at a temperature in the range of about 700° C. to about 800° C., by exposing said substrate to infrared lamps in an inert atmosphere at about atmospheric pressure.

14. A storage method according to claim 13, wherein said step of performing thermal processing is performed for a period of time not exceeding a few minutes.

15. A storage method according to claim 12, wherein said semiconductor substrate is stored under the condition that a water-proofing film to prevent entry of moisture into said dielectric film is formed on the surface of said heat-treated dielectric film.

16. A method for storing semiconductor wafers for manufacture of read-only memories in which data has been written, comprising the step of:

forming a plurality of memory cells for storing data on a semiconductor substrate made of a semiconductor wafer;

forming a dielectric film on said semiconductor substrate to cover said memory cells;

performing thermal processing on said substrate to reduce the water content of said dielectric film; and storing said semiconductor substrate after receiving said thermal processing until data is written in said memory cells, said semiconductor substrate being stored under the condition that a water-proofing film to prevent entry of moisture into said dielectric film is formed on the surface of said heat-treated dielectric film, wherein said water-proofing film is formed by a barrier metal.

* * * * *